METHOD OF MAKING SEMICONDUCTOR DEVICE

Filed July 6, 1965 3 Sheets-Sheet 1

INVENTOR.
David A. Kallander
BY Mueller & Aichele
ATTY'S.

March 1, 1966 D. A. KALLANDER 3,237,272

METHOD OF MAKING SEMICONDUCTOR DEVICE

Filed July 6, 1965 3 Sheets-Sheet 2

INVENTOR.
David A. Kallander

BY Mueller & Aichele

ATTY'S.

March 1, 1966 D. A. KALLANDER 3,237,272

METHOD OF MAKING SEMICONDUCTOR DEVICE

Filed July 6, 1965 3 Sheets-Sheet 3

INVENTOR.
David A. Kallander

BY [signature]

ATTY'S.

3,237,272

METHOD OF MAKING SEMICONDUCTOR DEVICE

David A. Kallander, Richardson, Tex., assignor to Motorola, Inc., Franklin Park, Ill., a corporation of Illinois

Filed July 6, 1965, Ser. No. 469,666
4 Claims. (Cl. 29—25.3)

This application is a continuation-in-part of application Serial No. 291,908, now abandoned, filed July 1, 1963.

This invention relates to semiconductor devices and in particular to silicon diodes so fabricated that no hermetically sealed container is required as protection for the semiconductor element. The invention also relates to the method of manufacture of such diodes.

There has been considerable interest in semiconductor devices which do not require a sealed container for the semiconductor element. The hermetically sealed container of most commercially available semiconductor devices accounts for a major portion of the cost of the device. The container is typically much larger than the semiconductor element which is an active part of the device and consequently there is considerable "wasted space." The desirability of eliminating such containers has been clear since the early days of the semiconductor industry, but since many electrical characteristics of a typical semiconductor element are strongly dependent on conditions at the surface of the element, the sealed container could not be eliminated until the semiconductor unit could be protected in some other way.

Semiconductor diodes have been encapsulated in plastic materials in the past, but these materials are inadequate in certain ways. Plastic materials are not adequately impervious to moisture and certain contaminants and may themselves act as contaminants. Plastic encapsulated diodes not having some other protecting means for the semiconductor material tend to show degradation with time. Such devices may even tend to fail with age unless given some additional protection to keep contaminating materials from the exposed surfaces of the junctions in the semiconductor.

One way of providing such protection is to form an inorganic glass layer at the surface of the semiconductor element. The glass layer isolates the underlying semiconductor material from moisture and other impurities. Equally important, the glass layer stabilizes the surface of the semiconductor material so that physical and chemical conditions at the otherwise exposed semiconductor surfaces are less likely to be changed by heat and electrical fields produced in the semiconductor element when the device is operating. The glass layer is also a good dielectric and tends to reduce the fringing electric fields which occur at the surface portions of PN junctions existing in the semiconductor device so that there is less ionization and less motion of ions at these regions when they are glass protected.

A semiconductor device consists of a semiconductor element and wire leads for making connection to it which are frequently stressed in many ways during assembly into an electronic apparatus and in subsequent use due to vibration and in other physical ways. Devices protected by glass films alone tend to lack in structural ruggedness and are easily broken. The glass-film protected semiconductor element with connective leads attached may be encapsulated with plastic material in order to give the completed device the desired suitable mechanical properties.

Glass protected semiconductor devices are described and claimed in a copending application of S. S. Flashchen and R. J. Gnaedinger, Jr., Serial No. 327,414, filed December 2, 1963, assigned to the present assignee, which is a division of Serial No. 109,439, filed May 11, 1962, assigned to the present assignee and also now abandoned. In one of the embodiments of that application a glass film of suitable thickness for protective purposes is formed on a silicon semiconductor element by heating the element at a temperature of 400 to 750° C. in an atmosphere containing oxygen (air is suitable) and an accelerating agent such as lead or a lead compound. The lead becomes incorporated in the glass as it forms by oxidation and acts to increase the oxidation rate. Because of this action the process is known as accelerated oxidation.

In applying the accelerated oxidation process to the fabrication of semiconductor diodes by mass production techniques, certain practical problems have been encountered. In order to meet commercial standards of product uniformity and reliability, it was found that the thickness of the glass film or layer should be about the same in all semiconductor elements of a given type. It has been difficult to control the thickness of the glass with a desired degree of accuracy and still obtain a reasonably high production rate. Furthermore, although it is possible to carry out the accelerated oxidation process at fairly low temperatures to reduce degradation of a contact metal on the semiconductor active elements, the oxidation conditions are still severe enough that most of the commonly used metallic contact materials will not withstand the oxidation process satisfactorily. Ideally, the metal contacts should remain stable and be essentially unaffected by the oxidation processing. It should not introduce undesirable contamination into the oxide film while it is forming and it should act as a mask so that no glass will form on the contact in order that soldering may be accomplished without extensive treatment for reconditioning the contacts subsequent to glassing.

Therefore, it is an object of this invention to provide a device that dispenses with the necessity for a sealing container without compromising the electrical and structural characteristics of the diode.

It is another object of the invention to provide a glass passivated diode which has improved electrical and mechanical characteristics.

It is yet another object of the invention to provide a means of producing a glass passivated diode which is suitable for mass production at low cost.

A feature of this invention is the use of special plating techniques which permit the subsequent oxidation of the active element of the device without degrading the diode or the contact metals thereon.

Another feature of the invention is an easily controllable process for forming glass films on the surfaces of very large quantities of semiconductor elements with the glass films exhibiting a high degree of uniformity of thickness and character.

Still another feature of the invention is the structure of the device utilizing nailhead shaped leads soldered to the semiconductor element and further secured by a molded silicone plastic body, all of which provide a means of efficiently cooling the semiconductor and provides a small but very rugged product.

The drawings and the following text serve to explain the invention in detail.

Figure 1:
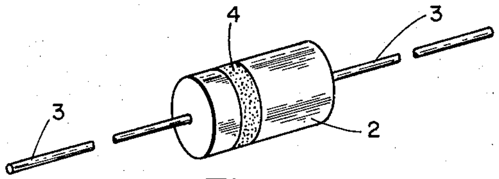
FIG. 1 is an isometric drawing of a diffused junction surface passivated diode after the device assembly has been completed.

FIG. 1 is an isometric drawing of the completed diode of this invention approximately four times actual size showing the body 2 and the two leads 3. The body has a band 4 painted around it to indicate the cathode end of the diode.

Figure 2:
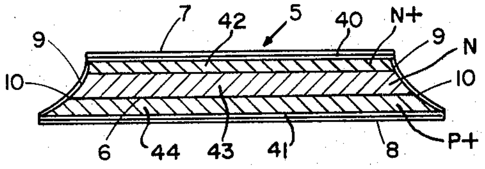
FIG. 2 is a cross section of a semiconductor die unit which is the active element of the diode.

Within the body of the diode is the active semiconductor element 5 of the device, and its sectional view across the diameter is shown in FIG. 2. The active element 5 is of silicon having a diffused PN junction 6 and having on the upper and the lower surfaces metal contacts 7 and 8 of nickel-rhodium or of nickel-rhodium platinum. The specific nature of the contacts will be explained further. The active element is passivated, and the passivating coating 9 is a film of lead silicate glass which covers the exposed surface portion 10 of the PN junction 6.

Figure 3:
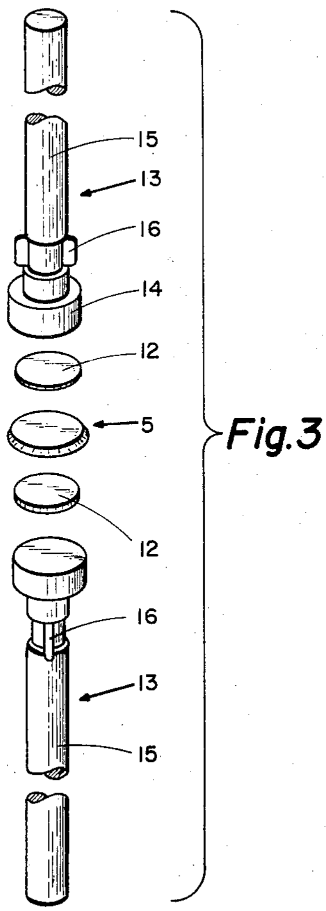
FIG. 3 is an exploded view showing the internal parts of the diode assembly.
Figure 4:
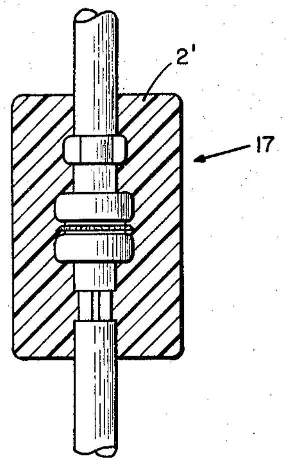
FIG. 4 is the assembled diode subsequent to the encapsulation.

Each diode is made up of five distinct piece parts which are shown enlarged in exploded view in FIG. 3. These piece parts are the active element 5, two solder disks 12 which are placed on either side of the active element, and a pair of nailhead leads 13 which will be soldered to the metallized portions 7 and 8 of the active element 5 with the solder disks 12. The leads have an enlarged or nailhead portion 14, a straight portion 15 and a flattened portion 16 (shown rotated 90° in the lower nailhead lead of FIG. 3). After a subsequent operation in which the silicone plastic body 2' is formed around the nailhead portion of the leads, the flattened regions 16 will substantially reduce any twisting or tensile action applied to the leads from being transmitted through the lead to the active element 5 thereby preventing any appreciable stress from being put on the active element or the soldered joints to the active element. These piece parts of FIG. 3 are assembled and soldered to form a subassembly which is then sealed within plastic material. The resulting device 17 is shown in a cross sectional view in FIG. 4.

The complete process for making the diode will now be described more fully

The active element 5 of the diode is made from a wafer of silicon which has been obtained from a single crystal ingot grown by conventional techniques. The crystal may be grown, for example, by the floating zone or Czochralski technique. The silicon crystal material may be either of N type or P type conductivity. The wafer is diffused using well-known paint-on diffusion techniques to form, on an N type wafer 43, a P+ layer 44 on one side and an N+ layer 42 on the other, giving a three layer structure.

The wafer is then treated in an electroless nickel plating solution to provide a thin film (20 to 25 microinches) of nickel on the opposed faces of the wafer. This is accomplished by immersing the wafers of silicon in a bath of electroless nickel solution comprised per liter of aqueous solution of:

| | Grams |
|---|---|
| Ammonium chloride | 50.4 |
| Nickelous chloride | 30.2 |
| Sodium Hypophosphite | 10.1 |
| Citric acid | 56.0 |

After mixing, the solution is adjusted to a pH of 9.6 by adding ammonium hydroxide. The bath is maintained at a temperature of 80° C. The wafer is removed from the solution after five minutes, rinsed in deionized water and dried and heated at a temperature of 700–850° C. in a hydrogen atmosphere to diffuse and/or alloy some of the nickel into the silicon and provide a good adherent metal coating. Then a further electroless nickel plating step at the same temperature for a period of two minutes is carried out to increase the thickness of the nickel plating about ten more microinches and to prepare the wafer for a subsequent rhodium plating step. The layers of nickel plating are shown as layers 40 and 41 of FIG. 2. The subsequent rhodium plating step is an electroplating operation and the nickel is in general necessary in order to provide suitable electrical contact for the electroplating operation. The layers of rhodium plating are shown as layers 7 and 8 of FIG. 2.

The rhodium plating is carried out in a standard plating bath at 50° C. The current density in the bath is 7 amperes per square foot and the solution used is a commercially available rhodium plating solution. The plating solution is, of course, kept agitated at all times. Following the rhodium plating operation, the wafers are rinsed in deionized water.

Figure 5:
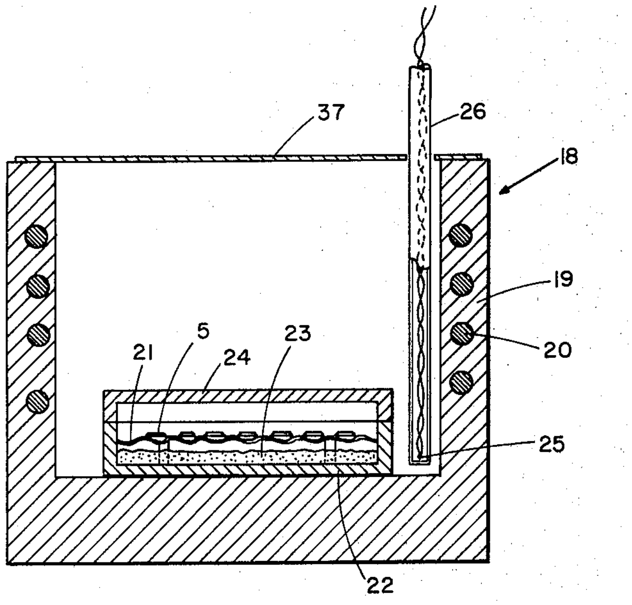
FIG. 5 is an apparatus for forming a passivating glass film on the exposed junction surfaces of the active elements of the semiconductor diodes.

The wafers are then cut into dice. After cutting into dice, it is necessary to passivate the dice prior to assembly. This is accomplished with the aid of the apparatus of FIG. 5. This apparatus consists of a cylindrical furnace having an insulating region and resistance heating coils 20 which are indicated schematically in this figure. The dice 5 are placed on a platinum mesh screen 21 in a small covered container 22 which has a layer of lead oxide 23 lying at the bottom of the container. The container 22 is of alumina material. The container is fitted with a loose fitting top 24 and the container also is of a configuration so that it will support the platinum screen 21 on which the dice 5 rest a short distance above the lead oxide. This container 22 is loaded with dice prior to placing it in the furnace. The dice 5 are placed on the platinum screen 20 in a one dice deep layer. This is contained and placed in about the center of the furnace 18 for more uniform heating. The furnace is equipped with a thermocouple 25 in a protective tube 26 which is connected to a controller (not shown), the function of which is to maintain the silicon-lead oxide container system at a relatively uniform temperature within the furnace. The furnace 17 is equipped with a loose fitting lid 37 of some reflective material such as aluminum.

The dice are heated at a temperature of 400–750° C. for 15–180 minutes and this forms a passivating layer of lead silicate glass which also serves to protect the junction boundary from the effect of contamination, etc. When the dice are processed as described, the lead silicate glass layer forms uniformly from die to die within each batch and there is also a high degree of uniformity from batch to batch. In the process of forming the glass which is an oxide of silicon and lead, oxidation of the silicon is carried out in the presence of lead oxide vapor and at the temperatures involved lead becomes incorporated into the silicon oxidation product which in turn substantially increases the oxidation rate. Because of this action the process is known as accelerated oxidation.

The advantages of using the platinum and/or rhodium are apparent at this time. At the temperatures required for accelerated oxidation, the glass does not form upon platinum or rhodium. The rhodium acts as a diffusion barrier against nickel diffusing to the outer surface of the wafer of the silicon. The rhodium itself can be used alone but has less resistance to attack by etches employed in the dicing process than the platinum. Therefore, it is desirable, but not essential, to use the platinum as a final plating.

Figure 6:
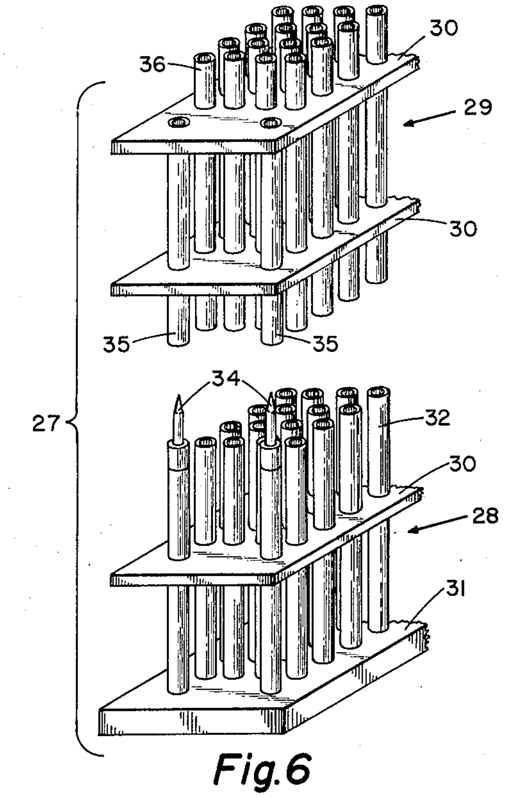
FIG. 6 is an assembly jig into which the parts of FIG. 3 are loaded in order to form the subassembly of FIG. 4.
Figure 7:
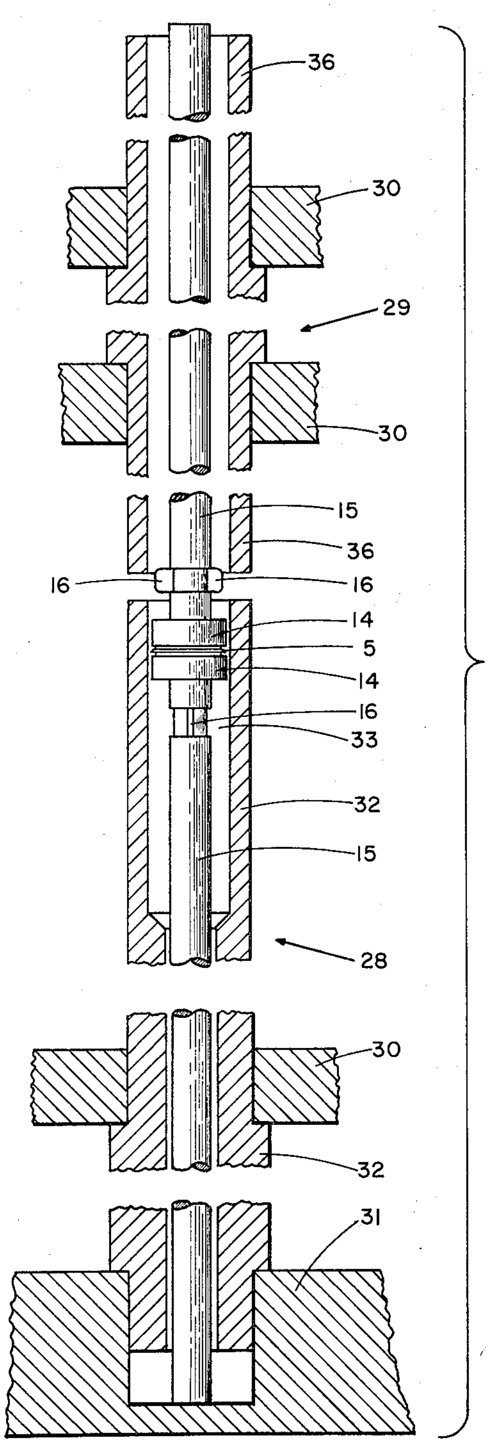
FIG. 7 shows a cross section of a portion of such an assembly jig loaded with the individual piece parts of FIG. 4 prior to heating in a soldering furnace.

The dice are now ready for assembly into a diode subassembly with the aid of an assembly jig 27 with a lower portion 28 and an upper portion 29 of stainless steel tubing pressed into stainless steel spacers 30 and a base 31 as illustrated in FIG. 6 and in section in FIG. 7. The lower tubes 32 of the jig have a large inside diameter portion 33 to clear the nailheads 14, silicon dice 5 and the two solder rings 12.

In the assembly operation, one nailhead lead 13 is placed in each lower tubular portion 25 of the jig 24. After the nailhead leads 13 are put into place in the bottom portion of the jig a solder disk is placed on each of the nailhead leads 13. Then a passivated silicon die 5 is placed on the solder disk. Another solder disk 12 is placed on top of each of the silicon wafers 5. The upper portion 29 of the jig is then placed on top of the lower portion 28 of the jig; alignment is maintained with a pair of locating pins 34 and tubes 35 at each end of the jig and then nailhead leads are placed in the tubes 36 of the upper portion of the jig 29 as shown in FIG. 7. The nailhead portion as is indicated rests on the upper solder disk.

The assembly jig is then passed through a furnace on a conveyor belt while in an upright position at a temperature sufficient to melt the solder and to cause the solder to fuse to the nailhead lead and the platinum-rhodium-nickel contact portion of the silicon. After heating at this temperature, the subassemblies 17 are allowed to cool after which they are unloaded from the jigs by removing the top portion of the assembly jig, and inverting the lower portion so that the subassemblies fall from the assembly jig. The subassemblies are then placed on racks (not shown) where the body portion 2 of the diode is molded around the subassembly. The diodes 1 are then tested to determine polarity and the polarity ring 4 is printed about the plastic body to indicate the cathode portion of the device and at this point the assembly of the device is complete and the device 1 is as shown in FIG. 1. The device is then electrically tested and this completes the processing.

A typical diode so manufactured has the following structure and characteristics. The active element or die is 60 mils in diameter and 8 mils thick. The dice have an N+ region ½–2 mils thick on a P region. A P+ region to lower the series resistance of the device was placed on the other side and has its impurity concentration grading out to essentially that of the bulk P material into which the diffusion was done. The bulk material has a resistivity of .01–1 ohm-centimeter.

The thicknesses of the nickel-platinum-rhodium is as described previously in the specification and the solder disks are of 95% lead and 5% tin material and are of about 1 mil in thickness.

The nailhead portion of the leads, which are of silver or of copper with a silver plate, are about 20 mils thick by about 60 mils in diameter. The leads are of a diameter of about 1/32 of an inch and each lead is slightly over one inch in length. The body diameter is of about ⅛ of an inch or less and less than a quarter of an inch long. The device is stable, has an operating and storage temperature range from a minus 65° C. to a plus 175° C., and has a D.C. power dissipation of some 750 milliwatts at a 50° C. ambient temperature. The device derates at approximately 6 milliwatts per degree Centigrade ambient above the 50° C. temperature.

*Table I*

| Symbol | Measurement | Value |
|---|---|---|
| $V_Z$ | Nominal zener voltage at 6.2 milliamps. Measured with the device junction in thermal equilibrium with a 25° C. ambient temperature while the test current (6.2 ma.) is applied. | 20 volts. |
| $Z_{ZT}$ | Maximum zener impedance at 6.2 milliamps. Derived from the 60 cycle A.C. voltage which results when an A.C. current having a R.M.S. value equal to 10% of the D.C. zener current (10% of 6.2 ma.) is superimposed on the D.C. zener current (6.2 ma.). | 25 ohms. |
| $I_{ZM}$ | Maximum D.C. zener current within rated power dissipation. | 32 ma. |
| $I_R$ | Maximum leakage current with a reverse voltage of 15 volts applied to the junction. | 5μa. |

Table I is a table of electrical characteristics of a typical 20 volt zener diode measured at 25° C. ambient temperature. The forward voltage is 1½ volts at a forward current of 200 milliamps for all units.

Zener diodes made according to this invention are excellent for use at high temperatures and are extremely stress, shocks and vibration resistant due to the component design and the supporting action of the plastic in which the components are molded. The diodes are characterized by high reliability at low cost due to the fact that the lead silicate glass film passivates and seals the junction from contaminants without the necessity of placing the junction in a hermetically sealed housing or header. Rectifiers may be made by essentially the same process.

I claim:

1. A process for making a diode, comprising diffusing a P impurity into one side of a silicon wafer of a selected conductivity type and diffusing an N impurity into the opposite side thereof to form a three layer junction structure, plating nickel on both sides of said wafer, plating rhodium over the nickel, breaking said wafer into dice, passivating by exposing said dice to an atmosphere containing lead oxide vapors and oxygen at a temperature in the range from 400° C. to 750° C. to form a lead silicate glass film around the edges of said dice covering the junctions therein, soldering two leads to the opposite sides of each said die element, and encapsulating each die element and adjoining portions of the leads therefor with plastic material.

2. A process for making a diode, including the steps of, diffusing a P impurity into one side of a silicon wafer of a selected conductivity type and diffusing an N impurity into the opposite side thereof to form a three layer junction structure, plating nickel on both sides of said wafer, plating rhodium over the nickel, breaking said wafer into dice, placing said dice in an enclosure containing lead oxide, and heating said enclosure to provide lead oxide vapors whereby a lead silicate glass film is formed around the edges of said dice.

3. A process for making a semiconductor device, including the steps of, providing a die of semiconductor material having at least one rectifying junction therein with said die having nickel plating on both sides and rhodium plating over said nickel plating, placing said die in an enclosure containing lead oxide, and heating said enclosure to provide lead oxide vapors whereby a lead silicate glass film is formed around the edges of said die.

4. The process of claim 1 further including the step of placing said dice flat on a platinum screen supported over and parallel to a layer of lead oxide and heating to provide said lead oxide vapors in said passivating step.

References Cited by the Examiner

UNITED STATES PATENTS

| | | | |
|---|---|---|---|
| 2,728,693 | 12/1955 | Cado | 117—5.5 X |
| 2,890,395 | 6/1959 | Lathrop | 29—25.3 X |
| 2,930,722 | 3/1960 | Ligenza | 29—25.3 X |
| 2,964,831 | 12/1960 | Peterson | 29—25.3 |
| 2,994,054 | 7/1961 | Peterson | 29—25.3 |
| 3,046,176 | 7/1962 | Bosenberg | 29—25.3 X |

FOREIGN PATENTS 878,544 10/1961 Great Britain.

WHITMORE A. WILTZ, *Primary Examiner.*

W. I. BROOKS, *Examiner*.